United States Patent [19]
Birkle et al.

[11] Patent Number: 5,206,534
[45] Date of Patent: Apr. 27, 1993

[54] PHOTOCELL

[75] Inventors: Siegfried Birkle, Hoechstadt A/Aisch; Johann Kammermaier, Unterhaching; Gerhard Rittmayer, Erlangen, all of Fed. Rep. of Germany

[73] Assignee: Siemens Aktiengesellschaft, München, Fed. Rep. of Germany

[21] Appl. No.: 747,695

[22] Filed: Aug. 20, 1991

[30] Foreign Application Priority Data

Aug. 20, 1990 [DE] Fed. Rep. of Germany ....... 4026315

[51] Int. Cl.$^5$ .................. H01L 27/14; H01L 31/00
[52] U.S. Cl. ..................... 257/464; 257/49; 257/184; 257/631
[58] Field of Search .............. 357/30 B, 30 E, 30 J, 357/30 R, 52, 2, 61, 16

[56] References Cited

U.S. PATENT DOCUMENTS

| | | | |
|---|---|---|---|
| 4,695,859 | 9/1987 | Guha et al. | 357/17 |
| 5,039,358 | 8/1991 | Birkle et al. | 357/2 |
| 5,055,421 | 10/1991 | Birkle et al. | 357/2 |
| 5,073,785 | 12/1991 | Jansen et al. | 427/38 |
| 5,079,178 | 1/1992 | Chouan et al. | 156/646 |
| 5,087,959 | 2/1992 | Omori et al. | 357/2 |

FOREIGN PATENT DOCUMENTS 0381109 1/1990 European Pat. Off.

OTHER PUBLICATIONS

Winstel, Von Günter "Siemens Energietechnik" No. 2, pp. 266-269 (1980).

*Primary Examiner*—Edward J. Wojciechowicz
*Assistant Examiner*—Sara W. Crane
*Attorney, Agent, or Firm*—Kenyon & Kenyon

[57] ABSTRACT

In the case of a photocell based on gallium arsenide or indium phosphide, a layer of amorphous, hydrogenous carbon (a-C:H) having a thickness of $\leq 0.1$ $\mu$m and a specific electrical resistance of $\geq 10^6$ $\Omega$.cm is placed on a layer of p-doped gallium arsenide (GaAs) or indium phosphide (InP).

12 Claims, No Drawings

PHOTOCELL

BACKGROUND OF THE INVENTION

The invention relates to a photocell based on gallium arsenide or indium phosphide.

Peak efficiency factors of about 20 % are achieved with solar cells made of the most widely used material, crystalline silicon. With gallium arsenide, higher efficiency factors are possible, namely up to 26 %. The higher efficiency in the case of gallium arsenide is due to a higher energy band gap of 1.6 eV, or a better adaptation to the spectral distribution of sunlight (c.f.: *Siemens Energietechnik* [*Siemens Power Engineering*], 2nd issue (1980), pp. 266-269). However, producing these types of photocells entails the following problems which need to be solved:

- protecting the surface of the semiconductor structure from chemical influences and mechanical effects, in other words passivation;
- elimination of surface reflections;
- producing a space-charge region for charge-carrier separation (p-n junction or Schottky barrier).

Photocells based on gallium arsenide or indium phosphide require extensive doping of the semiconductor to produce the p-n junctions. From a technical standpoint, this is very costly and involves many risks (i.e., insulation failures). Schottky barriers, which are produced as a result of the metal/semiconductor contact, absorb incident light or have too high of a resistance. According to the present state of the art, the passivation of these types of photocells is accomplished with the help of plastic layers, however the layers' moisture-blocking capability is limited. Passivation of these photocells can also be accomplished with glass, in which case, however, bonding is required.

SUMMARY OF THE INVENTION

The object of the invention is to provide photocells based on gallium arsenide or indium phosphide which can be easily produced and which are chemically protected at the same time.

In accordance with the invention this is achieved by placing a layer of amorphous, hydrogenated carbon (a-C:H) having a thickness of $\leq 0.1$ $\mu$m and a specific electrical resistance of $\geq 10^6$ $\Omega$.cm on a layer of p-doped gallium arsenide (GaAs) or indium phosphide (InP).

DETAILED DESCRIPTION OF THE INVENTION a-C:H/GaAs or a-C:H/InP heterostructures are used to produce photocells according to the invention. These heterostructures exhibit a boundary surface with few recombination centers.

The a-C:H layer is intrinsically n-conducting. In this manner, in the case of heterostructures of the mentioned type, a photovoltaically effective space-charge region with a low recombination rate results in the area of the boundary surface between the two semiconductors—without any n-doping. Charge-carrier losses due to recombination no longer occur with an a-C:H layer thickness which lies under the diffusion length for charge carriers, so that a high quantum efficiency of close to 1 is attained for the irradiated light.

Amorphous, hydrogenated carbon, in short a-C:H, is a carbon material which features an amorphous carbon network. This modification of carbon obtains its special properties, such as chemical resistance and electrical insulation, from the side-by-side arrangement of tetrahedral ($sp^3$) and trigonal ($sp^2$) hybridization. The amorphous structure is stabilized by incorporating hydrogen (about 10 to 40 atomic percentage). In addition, this hydrogen is chemically stably bonded, so that the Staebler-Wronski effect, as encountered for example in a-Si:H, cannot occur.

The photocells according to the invention have an a-C:H layer with a specific electrical resistance of $\geq 10^6$ $\Omega$.cm; preferably the specific electrical resistance amounts to $\leq 10^9$ $\Omega$.cm. The semiconductor material, that is GaAs or InP, is preferably available in monocrystalline form.

To manufacture photocells according to the invention or a-C:H/semiconductor heterostructures, an a-C:H layer of a thickness of up to 0.1 $\mu$m is applied to a substrate of monocrystalline, polycrystalline or amorphous gallium arsenide or rather indium phosphide. The a-C:H deposition takes place by means of a high-frequency, low-pressure plasma precipitation of gaseous hydrocarbons, optionally in the presence of hydrogen. By regulating the plasma conditions, one can thereby control the intrinsic electrical and optical properties of a-C:H within a relatively broad range and thus adapt the properties to the specific requirements. In the usual way, a contact layer is then applied to the rear side of the semiconductor layer of p-doped GaAs or InP. The front side of the a-C:H layer is then provided with a transparent electrode, for example an ITO electrode.

To deposit the a-C:H layer, it is preferable for the following conditions to prevail:

pressure $\leq$ 50 Pa power density: $\leq$ 5 W.cm$^{-2}$

DC-self-bias voltage: $< -800$ V.

In manufacturing an a-C:H/semiconductor heterostructure with a photovoltaically effective space-charge region in the area of the boundary surface, it is of crucial importance that —due to the nonthermal character of the a-C:H deposition—bonding conditions be able to be attained in the boundary surface, which are not feasible when thermal processes are applied. This contributes to the fact that in the thin a-C:H layer or in the boundary surface to the GaAs or InP there can be no recombination of charge-carrier pairs produced by photons. In this respect, it is also favorable for the semiconductor surface to be subjected to a plasma pretreatment—before the a-C:H deposition—for example with argon or hydrogen In this manner, disturbing foreign components, in particular oxides, are removed. With such a procedure, when the semiconductor surface is kept free of air, any free valencies that might be produced are saturated by the layer of a-C:H which then is deposited.

Due to the very low H$_2$O permeation coefficients (c.f. European Published Patent Application 0 381 109), the a-C:H/ semiconductor heterostructures of the photocells according to the invention are automatically passivated. Preferably, the a-C:H layers have an H$_2$O permeation coefficient of $< 5.10^{-13}$ m$^2$.s$^{-1}$. Due to the high refractive index, the a-C:H layers in the photocells also contribute considerably to the elimination of reflections.

With regard to responsivity, heterostructures according to the invention made of monocrystalline semiconductor material are comparable to crystalline silicon. Compared to known photocells based on GaAs or InP, the photocells according to the invention entail considerably less technological expenditure.

The invention shall be clarified in greater detail based on the following exemplified embodiment.

EXAMPLE

A 0.1 μm thick a-C:H layer is deposited on a p-doped substrate made of monocrystalline GaAs with a charge-carrier concentration of approximately $10^{18}$ cm$^{-3}$. This substrate had already undergone a pretreatment in an argon or hydrogen plasma (under the following pressure and energy conditions). The plasma precipitation takes place by means of radio-frequency excitation and by means of a DC self-bias voltage formed as a result of a capacitive energy coupling. Methane is used as the process gas; the working pressure amounts to 20 Pa. At a plasma power density of 2.5 W.cm$^{-2}$ on the substrate surface and a DC self-bias voltage of −900 V, one obtains an a-C:H layer with an optical energy band gap of 0.9 eV, a specific electrical resistance of $5.10^7$ ω. cm and an H$_2$O permeation coefficient of about $10^{-13}$ m$^2$.s$^{-1}$. As a comparison, the H$_2$O permeation coefficient of polyimide, for example, is about $10^{-10}$ m$^2$.s$^{-1}$.

When the photoconduction of the obtained a-C:H/GaAs heterostructure is measured (measuring voltage: 5 V), the result is a responsivity R of between 0.3 and 0.45 A.W.$^{-1}$ in the spectral range of 500 to 900 nm. According to the relation $$R = \frac{e \cdot \eta}{h \cdot \nu}$$

(c.f.: R Müller Bauelemente der Halbleiter-Elektronik [*Components of Semiconductor Electronics*], 3rd edition (1987), Springer Publishing House, pp. 48 and 49), from this a value of 0.4 to nearly 1 results for the wave-length dependent quantum efficiency η.

What is claimed is:

1. In a photocell based on gallium arsenide or indium phosphide, having a layer of p-doped gallium arsenide (GaAs) or indium phosphide (InP), the improvement comprising a layer of amorphous, hydrogenated carbon (a-C:H) having a thickness of ≦0.1 μm and a specific electrical resistance of ≧ $10^6$ Ω.cm disposed on the p-doped layer.

2. The photocell according to claim 1 wherein the specific electrical resistance of the a-C:H layer is ≦$10^9$ Ω.cm.

3. The photocell according to claim 1 wherein the GaAs and InP are monocrystalline.

4. The photocell according to claim 2 wherein the GaAs and InP are monocrystalline.

5. The photocell according to claim 1 wherein the a-C:H layer has an H$_2$O permeation coefficient of <$5.10^{-13}$ m$^2$.s$^{-1}$.

6. The photocell according to claim 2 wherein the a-C:H layer has an H$_2$O permeation coefficient of <$5.10^{-13}$ m$^2$.s$^{-1}$.

7. The photocell according to claim 3 wherein the a-C:H layer has an H$_2$O permeation coefficient of <$5:10^{-13}$ m$^2$.s$^{-1}$.

8. The photooell according to claim 4 wherein the a-C:H layer has an H$_2$O permeation coefficient of <$5.10^{-13}$ m$^2$.s$^{-1}$.

9. The photocell according to claim 1 wherein the a-C:H layer is produced by means of a high-frequency, low-pressure plasma precipitation of gaseous hydrocarbons.

10. The photocell according to claim 2 wherein the a-C:H layer is produced by means of a high-frequency, low-pressure plasma precipitation of gaseous hydrocarbons.

11. The photocell according to claim 3 wherein the a-C:H layer is produced by means of a high-frequency, low-pressure plasma precipitation of gaseous hydrocarbons.

12. The photocell according to claim 5 wherein the a-C:H layer is produced by means of a high-frequency, low-pressure plasma precipitation of gaseous hydrocarbons.

* * * * *